(12) United States Patent
Srinivasan et al.

(10) Patent No.: US 11,264,099 B2
(45) Date of Patent: Mar. 1, 2022

(54) APPARATUSES AND METHODS FOR AUTOMATED DYNAMIC WORD LINE START VOLTAGE

(71) Applicant: Micron Technology, Inc., Boise, ID (US)

(72) Inventors: Dheeraj Srinivasan, San Jose, CA (US); Jeffrey M. Tsai, San Jose, CA (US); Ali Mohammadzadeh, Mountain View, CA (US); Terry M. Grunzke, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/090,067

(22) Filed: Nov. 5, 2020

(65) Prior Publication Data

US 2021/0057031 A1 Feb. 25, 2021

Related U.S. Application Data

(63) Continuation of application No. 16/530,100, filed on Aug. 2, 2019, now Pat. No. 10,832,779, which is a
(Continued)

(51) Int. Cl.
*G11C 16/08* (2006.01)
*G06F 3/06* (2006.01)
(Continued)

(52) U.S. Cl.
CPC ............... *G11C 16/08* (2013.01); *G06F 3/06* (2013.01); *G11C 8/08* (2013.01); *G11C 16/12* (2013.01); *G11C 16/14* (2013.01); *G11C 16/30* (2013.01)

(58) Field of Classification Search
CPC .......... G11C 16/08; G11C 8/08; G11C 16/12; G11C 16/14; G11C 16/30; G06F 3/06; G06F 3/064; G06F 3/0679
See application file for complete search history.

(56) References Cited

U.S. PATENT DOCUMENTS

| 5,898,634 A | 4/1999 | Chevallier |
| 7,808,838 B2 | 10/2010 | Kim et al. |

(Continued)

FOREIGN PATENT DOCUMENTS

| JP | 2013-143155 A | 7/2013 |
| JP | 2016-501413 A | 1/2016 |

OTHER PUBLICATIONS

Extended Search Report from related European patent application No. 179025730, dated Nov. 16, 2020, 8 pages.
(Continued)

*Primary Examiner* — Jerome Leboeuf
(74) *Attorney, Agent, or Firm* — Brooks, Cameron & Huebsch, PLLC

(57) ABSTRACT

An example apparatus includes a controller and a memory device. The memory device is configured to maintain, internal to the memory device, a status of a number of open blocks in the memory device. The status can include a programming operation being initiated in the respective number of open blocks. Responsive to receipt of, from the controller, a request to direct initiation of the programming operation to a word line, determine a group of memory cells associated with the word line that programs first relative to other groups of memory cells associated with the word line and maintain, included in the status of an open block, a voltage at which the group of memory cells is the first group to program.

19 Claims, 5 Drawing Sheets

Related U.S. Application Data continuation of application No. 15/531,283, filed as application No. PCT/US2017/023402 on Mar. 21, 2017, now Pat. No. 10,388,379.

(51) Int. Cl.
*G11C 16/12* (2006.01)
*G11C 8/08* (2006.01)
*G11C 16/14* (2006.01)
*G11C 16/30* (2006.01)

(56) References Cited

U.S. PATENT DOCUMENTS

| | | | |
|---|---|---|---|
| 8,018,769 | B2 | 9/2011 | Tu et al. |
| 8,111,549 | B2 | 2/2012 | Yip |
| 9,032,271 | B2 | 5/2015 | Yongke et al. |
| 9,064,580 | B2 | 6/2015 | Senoo et al. |
| 2003/0086299 | A1 | 5/2003 | Yoshida |
| 2004/0047188 | A1 | 3/2004 | Clark et al. |
| 2008/0137432 | A1* | 6/2008 | Lee ............. G11C 29/021 365/185.19 |
| 2010/0008138 | A1 | 1/2010 | Wang |
| 2011/0007566 | A1 | 1/2011 | Roohparvar et al. |
| 2012/0243329 | A1* | 9/2012 | Nagashima ........... G11C 16/10 365/185.22 |
| 2013/0054880 | A1 | 2/2013 | Chang |
| 2013/0148435 | A1* | 6/2013 | Matsunaga ........... G06F 3/0655 365/185.23 |
| 2015/0186072 | A1 | 7/2015 | Darragh |
| 2016/0124641 | A1 | 5/2016 | Kim |
| 2016/0172046 | A1 | 6/2016 | Moon et al. |
| 2016/0180952 | A1 | 6/2016 | Darragh |
| 2016/0240256 | A1 | 8/2016 | Lin et al. |
| 2017/0287568 | A1 | 10/2017 | Yang |

OTHER PUBLICATIONS

Notice of Preliminary Rejection from related Korean patent application No. 10-2019-7026515 dated Dec. 7, 2020, 7 pages.

Office Action for related Taiwan Patent Application No. 106112979, dated Nov. 8, 2017, 24 pages.

International Search Report and Written Opinion for related PCT Application No. PCT/US2017023402, dated Dec. 14, 2017, 10 pages.

Decision of Rejection for related Taiwan Patent Application No. 106112979, dated Mar. 16, 2018, 8 pages.

Notice of Rejection Ground from related Japanese patent application No. 2019-551431, dated Aug. 7, 2020, 15 pages.

Office Action and Search Report from related Taiwan patent application No. 106112979, dated Jan. 14, 2020, 11 pages.

* cited by examiner

|  | PLANE 0 | PLANE 1 | PLANE 2 | PLANE 3 |
|---|---|---|---|---|
| SUPERBLOCK 0 | 0 | 5 | 6 | 7 |
| SUPERBLOCK 1 | 4 | 9 | 10 | 11 |
| SUPERBLOCK 2 | 8 | 1 | 2 | 3 |
| SUPERBLOCK 3 | 12 | 13 | 14 | 15 |
|  | ... | ... | ... | ... |
| SUPERBLOCK 4 | 500 | 501 | 502 | 503 |
| SUPERBLOCK 5 | 504 | 505 | 506 | 507 |
|  | ... | ... | ... | ... |
| SUPERBLOCK 6 | 808 | 813 | 814 | 815 |
| SUPERBLOCK 7 | 812 | 809 | 810 | 811 |
| SUPERBLOCK 8 | 816 | 817 | 818 | 819 |
|  | ... | ... | ... | ... |

*Fig. 4*

ADWLSV OPEN BLOCK LIST — 522

| SUPERBLOCK (551) | BLOCK (552) | DWLSV INFO (553) | ENTRY (554) |
|---|---|---|---|
| SUPERBLOCK 0 | BLOCK 5 | BLK 5 DWLSV INFO | ENTRY 0 |
| SUPERBLOCK 1 | BLOCK 11 | BLK 11 DWLSV INFO | ENTRY 1 |
| SUPERBLOCK 2 | BLOCK 8 | BLK 8 DWLSV INFO | ENTRY 2 |
| ⋮ | ⋮ | ⋮ | ⋮ |
| ⋮ | ⋮ | ⋮ | ⋮ |
| ⋮ | ⋮ | ⋮ | ⋮ |
| ⋮ | ⋮ | ⋮ | ⋮ |
| SUPERBLOCK 7 | BLOCK 810 | BLK 810 DWLSV INFO | ENTRY 7 |

(555)

| SUPERBLOCK | BLOCK | DWLSV INFO | ENTRY |
|---|---|---|---|
| SUPERBLOCK 0 | BLOCK 5 | BLK 5 DWLSV INFO | ENTRY 0 |
| SUPERBLOCK 8 | BLOCK 817 | BLK 817 DWLSV INFO | ENTRY 1 |
| SUPERBLOCK 2 | BLOCK 8 | BLK 8 DWLSV INFO | ENTRY 2 |
| ⋮ | ⋮ | ⋮ | ⋮ |
| ⋮ | ⋮ | ⋮ | ⋮ |
| ⋮ | ⋮ | ⋮ | ⋮ |
| ⋮ | ⋮ | ⋮ | ⋮ |
| SUPERBLOCK 7 | BLOCK 810 | BLK 810 DWLSV INFO | ENTRY 7 |

SYSTEM CONTROLLER SET FEATURES

| FEATURES | OPTIONS | DQ0 | DQ1 | DQ2 | DQ3 | DQ4 | DQ5 | DQ6 | DQ7 |
|---|---|---|---|---|---|---|---|---|---|
| P1 | | | | | | | | | |
| ADWLSV BLOCK LIST REMOVAL | NOT ENABLED (DEFAULT) | | | | | | | 0 | 0 |
| | REMOVE SELECTED BLOCKS FROM OPEN BLOCK LIST | | | | | | | 0 | 1 |
| | REMOVE ALL BLOCKS FROM OPEN BLOCK LIST | | | | | | | 1 | 0 |
| RESERVED | - - - | -- | -- | -- | -- | -- | -- | -- | -- |
| P2 | | | | | | | | | |
| ADWLSV BLOCK LIST STATUS | READ STATUS OF OPEN BLOCK LIST (DEFAULT) - ENTRIES AVAILABLE | | | | | | | | 0 |
| | READ STATUS OF OPEN BLOCK LIST - ALL ENTRIES USED | | | | | | | | 1 |
| RESERVED | - - - | -- | -- | -- | -- | -- | -- | -- | |
| P3 | | | | | | | | | |
| RESERVED | - - - | 0 | 0 | 0 | 0 | 0 | 0 | 0 | 0 |
| P4 | | | | | | | | | |
| RESERVED | - - - | 0 | 0 | 0 | 0 | 0 | 0 | 0 | 0 |

*Fig. 6*

APPARATUSES AND METHODS FOR AUTOMATED DYNAMIC WORD LINE START VOLTAGE

PRIORITY INFORMATION

This application is a Continuation of U.S. application Ser. No. 16/530,100, filed Aug. 2, 2019, which is a Continuation of U.S. application Ser. No. 15/531,283, filed May 26, 2017, now U.S. Pat. No. 10,388,379, issued Aug. 20, 2019, which is a National Stage Application under 35 U.S.C 371 of PCT/US2017/023402, filed Mar. 21, 2017, the contents of which are included herein by reference.

TECHNICAL FIELD

The present disclosure relates generally to semiconductor memory and methods, and more particularly, to apparatuses and methods for an automated dynamic word line start voltage.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory devices can be combined together to form a storage volume of a memory system such as a solid state drive (SSD). A solid state drive can include non-volatile memory (e.g., NAND flash memory and NOR flash memory), and/or can include volatile memory (e.g., DRAM and SRAM), among various other types of non-volatile and volatile memory.

An SSD can be used to replace hard disk drives as the main storage volume for a computer, as the solid state drive can have advantages over hard drives in terms of performance, size, weight, ruggedness, operating temperature range, and power consumption. For example, SSDs can have superior performance when compared to magnetic disk drives due to their lack of moving parts, which may avoid seek time, latency, and other electro-mechanical delays associated with magnetic disk drives.

Cumulative program and erase (P/E) cycles applied to memory cells of a memory device, such as an SSD, may result in programming time for the memory cells becoming faster as the number of P/E cycles increases. The memory cells becoming programmed at a progressively decreased program voltage relative to a program voltage used near a first P/E cycle may contribute to the programming time becoming faster. As such, an attempt to dynamically match a word line start voltage to the programming speed throughout a lifetime of the memory cells may be useful.

BRIEF DESCRIPTION OF THE DRAWINGS

FIG. 4 illustrates a table illustrating examples of particular blocks of memory cells of a multiplane memory device combined into superblocks in accordance with a number of embodiments of the present disclosure.

FIG. 5 illustrates a table illustrating examples of an ADWLSV open block list maintained internal to the multiplane memory device in accordance with a number of embodiments of the present disclosure.

FIG. 6 illustrates a table illustrating an example of a set features interface maintained internal to a host in accordance with a number of embodiments of the present disclosure.

DETAILED DESCRIPTION

Figure 1:
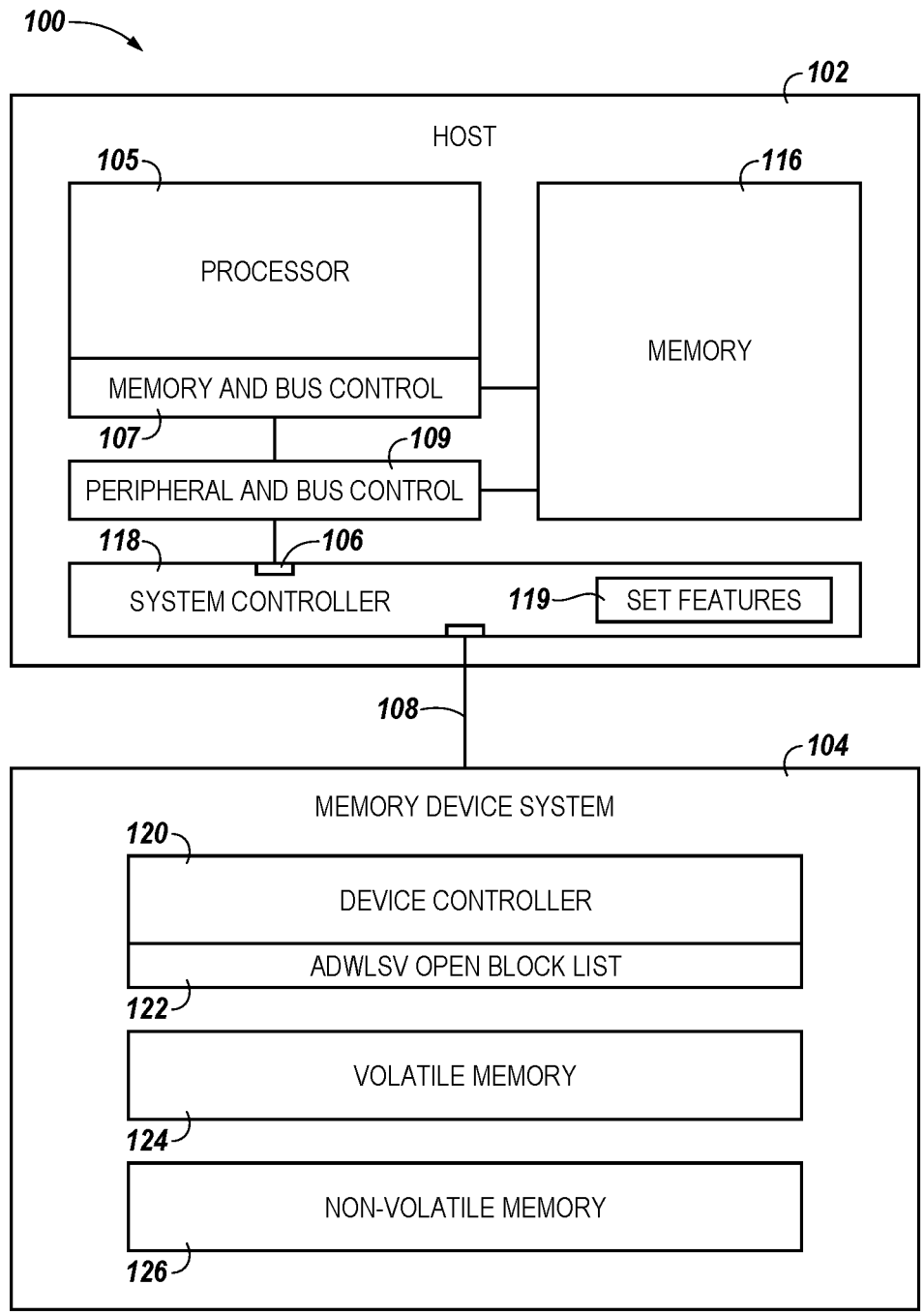
FIG. 1 is a block diagram of an apparatus in the form of a computing system for performance of automated dynamic word line start voltage (ADWLSV) operations in accordance a number of embodiments of the present disclosure.

The present disclosure relates to apparatuses and methods for an automated dynamic word line start voltage (ADWLSV). A word line start voltage, as described herein, is intended to mean a start voltage (e.g., selected from a sequence of pulse voltages) that is applied to a word line, also referred to as an "access line" herein, for programming (e.g., performing a write operation to) memory cells associated with (e.g., coupled to) the word line.

An example apparatus includes a controller and a memory device. The memory device is configured to maintain, internal to the memory device, a status of a number of open blocks in the memory device. The status can include a programming operation being initiated in the respective number of open blocks. Responsive to receipt of, from the controller, a request to direct initiation of the programming operation to a word line, determine a group of memory cells associated with the word line that programs first relative to other groups of memory cells associated with the word line and maintain, included in the status of an open block, a voltage at which the group of memory cells is the first group to program.

In a number of embodiments, the voltage at which the first group of memory cells programs can include the voltage at which the first group of memory cells passes a programming threshold first. The programming threshold may, for example, be a number of single level cells (SLC) in a group of memory cells (e.g., a page) transitioning (e.g., from 0 to 1, or vice versa) to or past a threshold number. The threshold number may, in a number of embodiments, be a particular number of memory cells out of a total number of memory cells and/or a percentage of the memory cells, among other possible thresholds.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

As used herein, "a number of" a particular thing can refer to one or more of such things (e.g., a number of memory devices can refer to one or more memory arrays). A "plurality of" is intended to refer to more than one of such things. Furthermore, the words "can" and "may" are used throughout this application in a permissive sense (i.e., having the potential to, being able to), not in a mandatory sense (i.e., must). The term "include", and derivations thereof, means "including, but not limited to". The terms "coupled" and "coupling" mean to be directly or indirectly connected physically or for access to and movement (transmission) of commands and/or data, as appropriate to the context.

The figures herein follow a numbering convention in which the first digit or digits correspond to the figure number and the remaining digits identify an element or component in the drawing. Similar elements or components between different figures may be identified by the use of similar digits. For example, 104 may reference element "04" in FIG. 1, and a similar element may be referenced as 204 in FIG. 2. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure, and should not be taken in a limiting sense.

FIG. 1 is a block diagram of an apparatus in the form of a computing system 100 for ADWLSV in accordance a number of embodiments of the present disclosure. As used herein, a host (e.g., 102), a memory device system (e.g., 104), a host controller (e.g., system controller 118), a memory device controller (e.g., device controller 120), or an ADWLSV open block list (e.g., 122) also might each be separately considered an "apparatus".

Computing system 100 includes a memory device system 104 (e.g., an SSD) coupled to a host 102 through a device interface 108. As used herein, "coupled to" is intended to refer to a connection between components, which may be an indirect communicative connection or direct communicative connection (e.g., without intervening components), whether wired or wireless, including connections such as, electrical, optical, magnetic, etc. The memory device system 104 can be a solid state storage appliance implemented using a number of SSDs, for example. The computing system 100 can include a controller internal to the memory device system 104 (e.g., device controller 120), in addition to the controller internal to the host (e.g., system controller 118). The device controller 120 may be coupled to a number of memory resources in the memory device system 104 via a number of suitable memory interfaces (not shown). The memory resources may, in a number of embodiments, include a number of SSD memory resources, such as volatile memory devices 124 and/or non-volatile memory devices 126.

The more P/E cycles that are applied to memory cells of the memory device, such as an SSD, the faster a programming time (e.g., as measured by elapsed time, speed, and/or rate of programming) for the memory cells may become relative to a programming time near a first P/E cycle in the lifetime of the memory device. The memory cells becoming programmed at a progressively decreased program voltage relative to a program voltage used near the first P/E cycle may contribute to the programming time becoming faster. The programming time may be further affected by a number of programming pulses applied to a selected word line in order to reach a threshold voltage (Vt) for the memory cells (e.g., the Vt also may be decreasing).

In some prior implementations, a fixed word line start voltage may be set at a voltage projected to be used near a projected last P/E cycle of the memory cells. In some prior implementations, a same number of programming pulses may be used throughout a lifetime of the memory device in order to maintain a constant programming time for the memory cells. However, among various considerations, the Vt for memory cells associated with different groupings of memory cells and/or at different positions of a word line (e.g., pages, blocks, superblocks, as described herein) may vary at the same point in the lifetime of the memory device, thereby affecting what would be an appropriate word line start voltage for the different groupings of memory cells and/or at the different positions of the word line.

The ADWLSV described herein dynamically matches a word line start voltage to the memory cells associated with the word line throughout the lifetime of the memory device. The matching may include, for example, dynamically sampling Vt movement (e.g., by application of the sequence of pulse voltages) of a group of memory cells (e.g., a page of memory cells). This may improve (e.g., decrease) the programming time by the memory device (e.g., rather than a host) tracking Vts for the memory cells associated with the word line and dynamically adjusting (e.g., increasing) the word line start voltage accordingly.

For example, the programming time may be decreased by increasing the word line start voltage to more closely match that of a first (e.g., fastest) group of memory cells (e.g., a page) to program associated with the word line and/or in a block of pages and using the same increased word line start voltage for other pages. Determining an appropriate word line start voltage for the first page to program may allow lower word line start voltages in the sequence of pulse voltages to be bypassed (e.g., skipped), thereby increasing the word line start voltage to be closer to that of the first page to program. Utilizing the increased word line start voltage determined for the first page to program may enable, as described herein, not utilizing the sequence of pulse voltages to determine an appropriate word line start voltage for the other pages associated with the same word line and/or in the same block. Moreover, utilizing the first page to program indicates that a low (e.g., lowest) pulse voltage of the sequence of pulse voltages effective for programming the first page is selected as the word line start voltage for all the pages, thereby reducing a possibility of overshooting a Vt for memory cells of other pages.

An ADWLSV open block list (e.g., 122) may be associated with (e.g., formed as part of) the device controller 120 internal to the memory device system 104. Entries may, in a number embodiments, be stored, until removed (e.g., erased), in an ADWLSV open block list (e.g., as shown at 522 and described in connection with FIG. 5).

A number of embodiments of the present disclosure can provide benefits such as improving programming performance (e.g., of write, read, erase, refresh operations, among other possible programming operations performed on memory cells) on groups of memory cells, such as pages, blocks, and/or superblocks, as compared to prior approaches. As described herein, a block may refer to a physical block of memory cells configured to store a plurality of pages (e.g., logical pages) of data.

An "open" block may refer to a physical block of memory cells in which, responsive to receipt of a request to direct initiation of a programming operation (e.g., a command to initiate a write operation) to a word line coupled to the block, an indicator (e.g., an entry) of the initiated programming operation is stored to document that the block is open. In a number of embodiments, the block and/or superblock may remain open until a last page in the block and/or the superblock is programmed, a request (e.g., a write command) is received to direct initiation of a programming operation to a first page of an already programmed block and/or superblock, and/or a command is received to remove (e.g., clear, erase, write over) a particular entry for a block and/or superblock.

In a number of embodiments, a superblock may refer to a first block in a first plane as a first page group associated with a word line and a second block in a second plane as a second page group associated with the word line in a multiplane memory device. As used herein, terms such as first, second, etc., may be utilized to distinguish one element from a similar element (e.g., the planes of a multiplane memory device) and may not, as appropriate to the context, denote an ordinal sequence of such elements and/or the position of such an element in a sequence of such elements (e.g., recitation of a "first block" may not mean that block is the first block at a beginning or end of a sequence of blocks). In addition, a multiplane memory device may include more than two planes (e.g., four planes as shown at 343 and described in connection with FIG. 3). For example, in a number of embodiments, a multiplane memory device may include 2, 4, 8, 16, etc., planes, among other possible numbers of planes.

The request to direct initiation of the programming operation may, in a number of embodiments, be issued from the host 102 via a host controller (e.g., system controller 118) to a memory device controller (e.g., device controller 120). A set features interface (e.g., 119) may be associated with (e.g., formed as part of) the system controller 118. An embodiment of the set features interface 119 is shown at 619 and described in connection with FIG. 6.

Example hosts 102 can include laptop computers, personal computers, digital cameras, digital recording and playback devices, mobile telephones, PDAs (personal digital assistants), memory card readers, and interface hubs, among other host systems. A host interface 106 may include a serial advanced technology attachment (SATA), peripheral component interconnect express (PCIe), or a universal serial bus (USB), among other connectors and interfaces for interaction with host components. In general, the host interface 106 in combination with the device interface 108 can provide an interface for passing control, address, data, and other signals between the memory device system 104 and the host 102.

Host 102 can include a number of processors 105 (e.g., parallel processors, co-processors, a central processing unit (CPU), etc.) coupled to a memory and bus control 107. The processor 105 can be a number of microprocessors, or some other type of controlling circuitry, such as a number of application-specific integrated circuits (ASICs), for example. Other components of the computing system 100 may also have processors. The memory and bus control 107 can have memory 116 and/or other components coupled thereto. In this example, memory and bus control 107 is coupled to a host memory 116, which in a number of embodiments may include volatile memory (e.g., DRAM) and/or non-volatile memory (e.g., NAND), among other types of memory. In this example, a peripheral and bus control 109 may be coupled (e.g., via the host interface 106) to the host memory 116, a flash drive (not shown) (e.g., via a universal serial bus (USB) interface), a non-volatile memory host control interface (NVMHCI) flash memory (not shown), and/or the memory device system 104 (e.g., via the system controller 118 and through the device interface 108). The memory device system 104 can be used in addition to, or in lieu of, a hard disk drive (HDD) in a number of different computing systems. The computing system 100 illustrated in FIG. 1 is one example of such a system; however, embodiments of the present disclosure are not limited to the configuration shown in FIG. 1.

As one example, the memory device system 104 can be a SSD. The memory device system 104 can include the device controller 120 (e.g., memory control circuitry, firmware, and/or software) coupled to a number of memory resources (e.g., volatile memory devices 124 and/or non-volatile memory devices 126) via a bus. Examples of SSD memory resources are described further in connection with FIGS. 2 and 3. Examples of buses (e.g., pins) for coupling the device controller 120 to a single unit memory device 230 are shown at 232 and described in connection with FIG. 2 (e.g., as input/output (I/O) lines I/O 0, I/O 1, . . . , I/O 7, although the number of such I/O lines are not limited to 8 I/O lines). Examples of buses (e.g., pins) for coupling the device controller 120 to a multiplane memory device 340, including a plurality of planes 343, are shown at 342 and described in connection with FIG. 3 (e.g., as data (DQ) buses DQ 0, DQ 1, . . . , DQ 7, although the number of such DQ buses are not limited to 8 I/O lines). The single unit memory device 230 with the I/O lines 232 shown in FIG. 2 and the multiplane memory device 340 with the DQ buses 342 shown in FIG. 3 are presented by way of example; however, embodiments of the present disclosure are not limited to these examples of buses.

The system controller 118 includes the host interface 106 for communication with the host 102 and a device interface 108 for communication with the memory devices 230 and/or 340 just described, via the buses 232 and/or 342, among other possibilities, in the volatile memory resources 124 and/or non-volatile memory resources 126. Various buses also can send and/or receive various signals (e.g., data signals, control signals, and/or address signals, among others) between the memory device 140 and/or the device controller 120 thereof and the system controller 118.

Although the example illustrated in FIG. 1 includes a single device interface 108 serving as a bus, the memory device system 104 can include a separate data bus (DQ bus), control bus, and/or address bus. Such buses can have various types of bus structures including, but not limited to, bus structures related to Open NAND Flash Interface (ONFI), Compact Flash Interface, Multimedia Card (MMC), Secure Digital (SD), CE-ATA, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI). The system controller 118 can be configured to support various data interface types associated with the memory device system 140 (e.g., NV-DDR, NV-DDR2, NV-DDR3, etc.).

The system controller 118 may include, in a number of embodiments, a translation component (not shown), which can be a flash translation layer (FTL), for example, associated with logical to physical address translation between the host 102 and memory device system 104. For instance, the translation component may include a mapping table of logical block addresses (LBAs) to physical block addresses (PBAs). The pages, blocks, planes, superblocks, and/or associated word lines described herein also may be mapped from logical addresses to physical addresses (e.g., by the device controller 120). For example, statuses of the superblocks 446 and 551, blocks 552, and planes 443 shown as documented in tables and described in connection with FIGS. 4 and 5 may each include a link to the physical addresses thereof, in combination with an address to each of the word lines with which they are associated (e.g., coupled). Although not shown in FIG. 1, device controller 120 may also include various other components implemented in hardware, firmware, and/or software and associated with management of memory device system 104.

Figure 2:
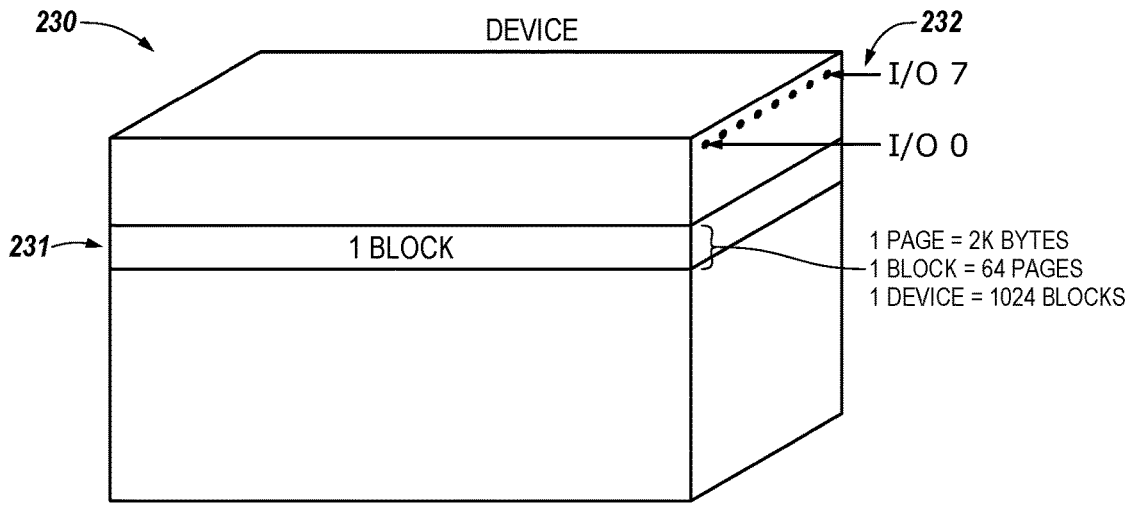
FIG. 2 is a block diagram of an apparatus in the form of a memory device configured to perform ADWLSV operations in accordance with a number of embodiments of the present disclosure.
Figure 3:
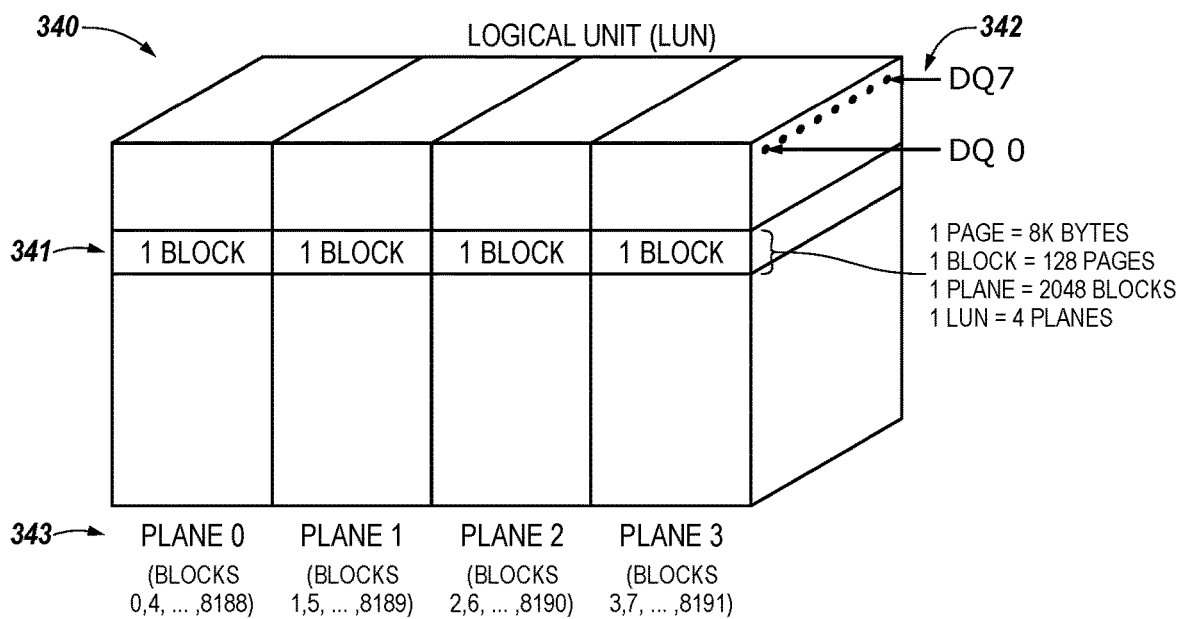
FIG. 3 is a block diagram of an apparatus in the form of a multiplane memory device configured to perform ADWLSV operations in accordance with a number of embodiments of the present disclosure.

FIG. 2 is a block diagram of an apparatus in the form of a memory device 230 configured to perform ADWLSV operations in accordance with a number of embodiments of the present disclosure. The memory device 230 illustrated in FIG. 2 shows an example of single unit memory device that may, in a number of embodiments, be utilized for performance of ADWLSV operations, as described herein. The memory device 230 may be configured as a volatile memory resource (e.g., DRAM, among other volatile memory device configurations) or as a non-volatile memory resource (e.g., NAND, among other non-volatile memory device configurations).

As described in connection with FIG. 1, the memory device 230 illustrated in FIG. 2 can include a number of buses 232 (e.g., I/O 0, I/O 1, . . . , I/O 7) for coupling to the device controller 120 internal to the memory device system 104 including memory device 230 (e.g., for input and/or output of programming operations as directed, via the device interface 106, by the system controller 118 internal to the host 102). The memory device 230 may, in a number of embodiments, include a plurality of blocks, as described herein. As one example, a single block (e.g., 231) may include 64 pages associated with a number of word lines (not shown). In this example, eight pages each associated with a single word line, with each word line coupled to a single bus (e.g., eight buses 232 in FIG. 2), yields 64 pages for the single block 231. In a number of embodiments, each page may have a data storage capacity of 2048 (2K) bytes and the memory device 230 may have 1024 (1K) blocks; however, embodiments of the present disclosure are not limited to the configuration shown in FIG. 2.

Each word line described in connection with FIG. 2 may be coupled to a bus 232. In a number of embodiments, each bus may be coupled to one or more word lines. For example, a plurality of word lines per bus 232 may be oriented vertically (e.g., stacked) in the block 231 to form a multiple of the number of buses (e.g., eight in FIG. 2) times the number of the plurality of word lines per bus 232 as the number of word lines per block 231.

FIG. 3 is a block diagram of an apparatus in the form of a multiplane memory device 340 configured to perform ADWLSV operations in accordance with a number of embodiments of the present disclosure. The multiplane memory device 340 illustrated in FIG. 3 shows an example of a four plane memory device (e.g., plane 0, plane 1, plane 2, and plane 3 as shown at 343, although embodiments may include 2, 4, 8, 16, etc., planes) that may, in a number of embodiments, be utilized for performance of ADWLSV operations. A combination of the plurality of planes of the multiplane memory device 340 may be termed a logical unit (LUN). The multiplane memory device 340 may be configured as a volatile memory resource (e.g., DRAM, among other volatile memory device configurations) or as a non-volatile memory resource (e.g., NAND, among other non-volatile memory device configurations). For clarity, the multiplane memory device 340 illustrated in FIG. 3 is described below in the non-volatile NAND configuration.

In a number of embodiments, the LUN 340 may provide a storage volume for the memory device system 104 shown and described in connection with FIG. 1. The planes 343 can be dies or chips, which when combined can be referred to as the LUN 340. For example, the planes 343 can be multi-chip packages (MCPs) that each include a number of dies. The dies can be, for example, NAND dies that include a number of arrays of NAND flash memory cells and associated peripheral circuitry (e.g., write circuitry, read circuitry, I/O circuitry, buffers, etc.).

As described in connection with FIG. 1, the LUN 340 illustrated in FIG. 3 can include a number of buses 342 (e.g., data buses DQ 0, DQ 1, . . . , DQ 7) for coupling to the device controller 120 internal to the memory device system 104 (e.g., for input and/or output of programming operations as directed, via the device interface 106, by the system controller 118 internal to the host 102). Each of the memory planes 343 may, in a number of embodiments, include a plurality of blocks, as described herein. As one example, a single block (e.g., 341) in each plane may include 128 pages associated with a number of word lines (not shown). In this example, 16 pages each associated with a single word line, with each word line coupled to a single bus (e.g., eight buses 342 in FIG. 3), yields 128 pages for a single block 341 in each plane 343. In a number of embodiments, each page may have a data storage capacity of 8192 (8K) bytes and each plane 343 of the LUN 340 may have 2048 (2K) blocks. As illustrated in FIG. 3, the combination of the planes of the LUN may include 8192 (8K) blocks (4 planes times 2048 blocks per plane equals 8192 blocks); however, embodiments of the present disclosure are not limited to the configuration shown in FIG. 3.

The system controller 118 and/or the device controller 120 may address a combination of the blocks (along with the pages therein) of the LUN 340 as a single unit (e.g., a superblock, as shown at 446 and described in connection with FIG. 4). For example, for the four plane LUN 340 shown in FIG. 3 to include 8192 blocks, plane 0 may include blocks 0, 4, . . . , 8188, plane 1 may include blocks 1, 5, . . . , 8189, plane 2 may include blocks 2, 6, . . . , 8190, and plane 3 may include blocks 3, 7, . . . , 8191. Hence, as one example, a superblock may be addressed as block 0, block 1, block 2, and block 3, in corresponding planes 0, 1, 2, and 3, for performance of a programing operation that includes performance of an ADWLSV operation.

Each word line described in connection with FIG. 3 may be coupled to a bus 342. In a number of embodiments, each bus may be coupled to one or more word lines. For example, a plurality of word lines per bus 342 may be oriented vertically (e.g., stacked) in each block 341 of each plane 343 to form a multiple of the number of buses (e.g., eight in FIG. 3) times the number of the plurality of word lines per bus 342 as the number of word lines per block 341.

In the example shown in FIG. 3, each block 0, 1, . . . , 8191 and/or superblock formed from a block from each of clocks 0, 1, 2, and 3 includes memory cells which can be erased together as a unit (e.g., the cells in each physical block can be erased in a substantially simultaneous manner as an erase unit). Each block may include a number of physical rows of memory cells that can each be coupled to a respective word line (e.g., access line). The number of rows in each block can be 32, 64, or 128, but embodiments are not limited to a particular number of rows, which can be referred to collectively as rows per block.

As one of ordinary skill in the art will appreciate, each row coupled to a word line can include a number of physical pages of cells. A physical page of cells can refer to a number of memory cells that may be programmed and/or written together or as a functional group. For instance, each row can include multiple physical pages of cells (e.g., an even page associated with cells coupled to even-numbered bit lines, and an odd page associated with cells coupled to odd numbered bit lines). Additionally, for embodiments including multilevel cells, a physical page can store multiple logical pages of data with each cell in a physical page contributing a bit toward a logical lower page, a bit toward a logical upper page, and one or more bits toward a respective number of logical intermediate pages.

The NAND memory devices described as example memory resources for the memory device 230 illustrated in FIG. 2 and/or the LUN 340 illustrated in FIG. 3 may, in a number of embodiments, include NAND dies (e.g., NAND flash arrays) that have single level cells (SLCs) configured to store a single data unit (e.g., one bit), and/or multilevel cells (MLCs) configured to store more than one data unit. Additionally, the cells can be programmable via various different programming processes, which can depend on the quantity of data units stored per cell; however, cells configured to store a particular quantity of data units (e.g., 2 bits, 3 bits, 4 bits, etc.) per cell can be programmable via different programming processes. For example, a 3-bit MLC might be programmable via a two-pass programming process (e.g., a 4-8 process in which a first programming pass places the threshold voltage of the cells from an erase state into one of four distributions based on a lower page and middle page data state and in which a second programming pass places the threshold voltage of the cells from the one of four distributions into one of eight distributions based on the upper page data state), or a three-pass programming process (e.g., a 2-4-8 process).

Embodiments of the present disclosure are not limited to the example shown in FIG. 3. For instance, memory systems in accordance with embodiments of the present disclosure can include more or fewer than four planes 343 per LUN 340 and are not limited to a particular memory array architecture (e.g., NAND, NOR, DRAM, PCM, etc.). In addition, although one device controller 120 is shown per memory device system in FIG. 1, embodiments may include a device controller 120 per memory device 230 in FIG. 2 and/or a device controller 120 per LUN 340 or plane 343 thereof in FIG. 3 (e.g., one controller per NAND die).

The memory devices 230 and/or 340, along with device controller 120, of memory device system 104 are configured to track and/control programing operations (e.g., write operations). In a number of embodiments, the device controller 120 (e.g., in combination with an associated ADWLSV open block list shown at 522 and described in connection with FIG. 5) can maintain, internal to the memory device system 104, a status of a number of open blocks in the memory devices (e.g., the ADWLSV open block list 522). The status can include a programming operation being initiated in the respective number of open blocks (e.g., by the blocks appearing in the ADWLSV open block list 522). The status can be documented in the ADWLSV open block list 522 responsive to receipt of (e.g., from the system controller 118) a request to direct initiation of the programming operation to a word line. Further in response to the request, a first group of memory cells (e.g., a page, block, and/or superblock of memory cells, as described herein) associated with the word line can be determined to program first relative to other groups of memory cells associated with the word line.

Included in the status of an open block, a voltage may be maintained at which the first group of memory cells programs. As described herein, the voltage at which the first group of memory cells programs can, in a number of embodiments, be the voltage at which the first group of memory cells passes a programming threshold first. The status can further include the open block list that including storage of (e.g., a link to) a number of logical and/or physical addresses indicating the pages, blocks, planes, superblocks, and/or associated word lines line of the open block in the ADWLSV open block list 522.

The device controller 120 of the memory device system 104 can be further configured to apply a sequence of pulse voltages to the word line to determine a particular voltage in the sequence at which the first group of memory cells associated with the word line programs first (e.g., via dynamically sampling Vt movement). The voltage at which the first group of memory cells programs can be utilized as the voltage applied to a second group of memory cells associated with the word line for a programming operation performed on the second group of memory cells. For example, as shown at 555 in the ADWLSV open block list 522, superblock 1 may have block 11 (e.g., documented at 522) determined to be the block that programs first (e.g., among blocks 4, 9, 10, and 11 that are combined to form superblock 1). The voltage at which block 11 is determined to be the first top program may be included among information (e.g., documented at 553) included in the status of the ADWLSV open block list 522. The voltage at which the first group of memory cells programs can be utilized as an ADWLSV for a programming operation performed on a second group of memory cells associated with the word line (e.g., blocks 4, 9, and 10).

The device controller 120 of the memory device system 104 can be further configured to apply the sequence of pulse voltages to the word line and automatically (e.g., dynamically) update in the status of the open block (e.g., in the ADWLSV open block list 522) an ADWLSV for a programming operation as the voltage at which the first group of memory cells programs. The ADWLSV may, in a number of embodiments, be dynamically updated for a word line in the open block corresponding to removal (e.g., erasure) of a block associated with the word line. For example, the block may be removed because the block has been determined to no longer be the block that programs first. The block may be automatically replaced with another block that application of the sequence of pulse voltages has determined to program first.

The device controller 120 of the memory device system 104 can be further configured, as described herein, to utilize the voltage at which the first group of memory cells programs to bypass (e.g., skip) a number of start voltages in a sequence of pulse voltages applied to a second group of memory cells associated with the word line in a programming operation performed on the second group of memory cells. Utilizing the word line start voltage for the first page and/or block to program may allow lower word line start voltages in the sequence of pulse voltages to be bypassed to adjust (e.g., increase) the word line start voltage to be closer to that of the first program. Utilizing the adjusted word line start voltage may enable not utilizing the sequence of pulse voltages to determine an appropriate word line start voltage for the other pages and/or blocks associated with the same word line.

The system controller 118 can, in a number of embodiments, be coupled to the host 102 (e.g., components of the host, as described herein) via the host interface 106 and further coupled to a number of memory devices (e.g., internal to the memory device system 104) via the device interface 108. The system controller 118 can be configured to direct initiation of a write operation to a page of a block associated with a word line. An example memory device (e.g., as shown at 230 and/or 340) can include a plurality of blocks configured to store pages of data. The memory device can be configured to open the block and determine a particular page of the open block to program first responsive to receipt of, from the system controller 118, a write request to direct the initiation of the write operation. The memory device can be further configured to maintain, internal to the memory device, a status of a number of open blocks in the memory device. The status can, in a number of embodiments, include an initiated write operation in the respective number of open blocks and a voltage at which the particular page (e.g., the page being part of a particular block) is the first page to program in the respective number of open blocks.

In contrast to the device controller 120, the system controller 118, in a number of embodiments, is not configured to track open blocks corresponding to pages of the memory device. The system controller 118 also is not configured to update the status of an open block to include a DWLSV for a write operation as the voltage at which the first page programs. In further contrast to the device controller 120, the system controller can include a set features interface (e.g., as shown at 119 in FIGS. 1 and 619 in FIG. 6) configured to direct removal of an entry 554 in the ADWLSV open block list 522 maintained internal to the memory device. The entry can include an ADWLSV 553 for the first page to open of the open block.

The internal device controller 120, in contrast to the system controller 118, can be configured to track open blocks corresponding to pages of the memory device. In further contrast to the system controller 118, the device controller 120 can be configured to dynamically update the ADWLSV information 553, including the voltage at which a particular page is the first page to program, for tracked open blocks.

The write request (e.g., from the system controller 118) can, in a number of embodiments, include a block identifier and/or a page identifier (e.g., physical addresses of the block and/or page for direction of the write operation). However, the system controller 118 can be unaware of whether the block identifier corresponds to an open block when sending the write request. In contrast, the status of a particular block being open can be documented by being an entry 554 of a block and/or superblock 551 in the ADWLSV open block list 522 associated with the device controller 120.

The system controller 118 coupled to the host 102 can, in a number of embodiments, be a system SSD controller that can be further coupled, via a bus (e.g., device interface 108), to an internal SSD device controller (e.g., operating as the device controller 120) of the memory device. The memory device in the memory device system 104 coupled to the internal SSD device controller can, in a number of embodiments, be a number of SSDs configured as a volatile memory resource (e.g., as shown at 124 and described in connection with FIG. 1 and elsewhere herein) and/or as a non-volatile memory resource (e.g., as shown at 126 and described in connection with FIG. 1 and elsewhere herein).

An example of a non-volatile memory resource can be configured as a non-volatile multiplane memory resource (e.g., LUN 340 described in connection with FIG. 3). The multiplane memory resource can be configured to form a superblock (e.g., superblocks 446 described in connection with FIG. 4) that can each include a plurality of planes 443. An example of a superblock can include a first block in a first plane (e.g., plane 1) as a first page group associated with a word line and a second block in a second plane (e.g., plane 2) as a second page group associated with the word line. The first block in the first plane and the second block in the second plane can be configured to perform write operations concurrently as directed by the SSD controller internal to the memory device system. As described herein, the memory device (e.g., the SSD controller internal to the memory device system) can be further configured to utilize the voltage at which the first page in the first plane or the second page in the second plane is the first to program as the voltage applied in a write operation to another group of memory cells in the other plane associated with the word line.

FIG. 4 illustrates a table illustrating examples of particular blocks of memory cells of a multiplane memory device 343 combined into superblocks 446 in accordance with a number of embodiments of the present disclosure. Groups of memory cells can be organized as a number of physical blocks in accordance with a number of embodiments of the present disclosure. As one example illustrated in FIG. 3, the number of physical blocks can be organized as blocks 0, 4, . . . , 8188 in plane 0, blocks 1, 5, . . . , 8189 in plane 1, blocks 2, 6, . . . , 8190 in plane, and blocks 3, 7, . . . , 8191 in plane 3 of a multiplane memory device 340.

The table illustrated in FIG. 4 shows a number of example superblocks 446 that combine one block from each of planes 0, 1, 2, and 3 that have been utilized, or may potentially be utilized, to form an open superblock in a programming operation (e.g., a write operation). The superblocks (e.g., superblocks 0, 1, . . . , 8) may be subject to performance of ADWLSV operations, as described herein, to determine an appropriate word line start voltage for each superblock (e.g., as shown at 522 and described in connection with FIG. 5).

In a number of examples, various combinations of blocks may be combined to form a superblock. FIG. 4 illustrates a few of these examples; however, embodiments of the present disclosure are not limited to the configuration of the superblocks shown in FIG. 4. For example, superblock 0 is shown to include block 0, block 5, block 6, and block 7, in corresponding planes 0, 1, 2, and 3. Superblock 1 is shown to include block 4, block 9, block 10, and block 11, in corresponding planes 0, 1, 2, and 3. Among other superblocks, the table also shows superblock 8 to include block 816, block 817, block 818, and block 819, in corresponding planes 0, 1, 2, and 3.

The number of combinations of blocks that form the superblocks 446 is shown to be nine in FIG. 4; however, embodiments are not limited to a particular number of superblocks being listed in the table. For example, as indicated by the ellipses in the table, any combination of the blocks 0, 1, . . . , 8191 from the appropriate planes 0, 1, 2, and 3 may be listed in the table. In addition, the superblocks are listed as superblock numbers 0, 1, . . . , 8 for clarity. However, as indicated by the ellipses between superblocks 3 and 4 and superblocks 5 and 6, there can be any number of superblocks between these consecutively listed superblocks, and after superblock 8, which may affect the numbering sequence and/or the total number of superblocks.

FIG. 5 illustrates a table illustrating examples of an ADWLSV open block list 522 maintained internal to the multiplane memory device in accordance with a number of embodiments of the present disclosure.

As described herein, an open block may refer to a physical block of memory cells in which, responsive to receipt of a request to direct initiation of a programming operation to a word line coupled to the block, an indicator (e.g., an entry) of the initiated programming operation is stored to document that the block is open. In a number of embodiments, the block and/or superblock may remain open until a last page in the block and/or the superblock is programmed, a request (e.g., a write command from system controller 118 via device controller 120) is received to direct initiation of a programming operation to a first page of an already programmed block and/or superblock, and/or a command is received to remove (e.g., erase) a particular entry for a block and/or superblock. In a number of embodiments, a command to remove a number of entries may be received from the system controller 118 via the device controller 120 utilizing a set features interface (e.g., as shown at 119 and 619 and described further in connection with FIG. 6).

The memory device system 104 may be configured to maintain, in the ADWLSV open block list 522 internal to the memory device system 104, a status of a number of open blocks in the memory device system 104. The status can include that a programming operation has been initiated in the number of open blocks by the particular blocks being listed in the ADWLSV open block list (e.g., in response to receipt of a request to direct initiation of the programming operation to a word line).

As described herein, an open block list may include, in a number embodiments, a number of entries 554 that are stored therein until removed. As one example, the ADWLSV open block list 522 illustrated in FIG. 5 may allow (e.g., be limited to) eight entries (e.g., entry 0, entry 1, . . . , entry 7; however, embodiments of ADWLSV open block lists are not limited to the number of entries shown in FIG. 5). For example, an ADWLSV open block list may be configured to allow 4, 8, 16, 32, etc., open block entries, among other possible numbers of entries. The number of entries in the ADWLSV open block list 522 may be determined by available area in the memory device and/or a controller thereof, complexity, and/or cost thereof, among other considerations.

An example ADWLSV open block list 522 illustrated in FIG. 5 may, in a number of embodiments, be maintained internal to a memory device system 104 that includes, and/or internal to a device controller (e.g., device controller 120 shown in memory device system 104 and described in connection with FIG. 1) that is associated with (e.g., coupled to), a multiplane memory device (e.g., LUN 340 shown in and described in connection with FIG. 3). The ADWLSV open block list 522 may list a number of open superblocks 551, which at any point in time, depending on the programming activity LUN 304, may include no open superblocks, one open superblock, or a plurality of open (e.g., superblocks 0, . . . , 7 as shown in FIG. 5).

For each open superblock 551, the memory device system 104 may determine (e.g., via dynamically sampling Vt movement) a group of memory cells (e.g., a block 552) that programs first relative to other blocks associated with the word line and included in the superblock. The block 552 that programs first may be associated with a particular word line to which a programming operation (e.g., write operation) is directed. An indicator of the block 552 (e.g., a number of the block, as shown and described in connection with planes 0, 1, 2, and 3 of FIG. 4) may be maintained (e.g., documented) in the ADWLSV open block list 522 as part of the status of each entry 544 and/or each open superblock 551. Further ADWLSV information (info) may, in a number of embodiments, be recorded in the ADWLSV open block list 522 as part of the status of each entry 544 and/or each open superblock 551. As one example, the further ADWLSV info 553 may include a particular voltage at which a particular block 552 is the first block to program.

For example, entry 1 (as shown in bold at 555) of the upper ADWLSV open block list 522 documented at a first point in time (e.g., before the lower ADWLSV open block list 522 is documented) illustrates entry 1 to document superblock 1 (e.g., as shown in FIG. 4) as being open. As shown in FIG. 4, block 11 is in plane 3 and is part of superblock 1, in combination with block 4 from plane 0, block 9 from plane 1, and block 10 from plane 2. Entry 1 at 555 in FIG. 5 shows block 11 at 522 as being the first to program, relative to the other blocks 4, 9, and 10 of superblock 1. The block 11 ADWLSV info 553 includes the particular voltage at which block 11 is determined to be the first block to program. As such, the particular voltage for block 11 may be utilized as the word line start voltage for programming (e.g., performing a write operation to) memory cells in the other blocks associated with (e.g., coupled to) the word line and/or combined with block 11 to form superblock 1.

Entry 1 (as shown in bold at 556) of the lower ADWLSV open block list 522, which may be the same open block list as shown in the upper list that is documented at a second point in time (e.g., after the upper ADWLSV open block list 522 is documented) illustrates entry 1 to document superblock 8 (e.g., as shown in FIG. 4) as being open. As shown in FIG. 4, block 817 is in plane 1 and is part of superblock 8, in combination with block 816 from plane 0, block 818 from plane 2, and block 819 from plane 3. Entry 1 at 556 in FIG. 5 shows block 817 at 522 as being the first to program, relative to the other blocks 816, 818, and 819 of superblock 8. The block 817 ADWLSV info 553 includes the particular voltage at which block 817 is determined to be the first block to program. As such, the particular voltage for block 817 may be utilized as the word line start voltage for programming memory cells in the other blocks associated with the word line and/or combined with block 817 to form superblock 8.

Similar status information concerning other open blocks and/or superblocks (e.g., for each of entries 0, 1 . . . . , 7) may be dynamically documented (e.g., updated) at various time points (e.g., to dynamically document the programming activity of LUN 304). For example, the information for an entry (e.g., entry 1) concerning a superblock that is no longer open (e.g., superblock 1), and thereby having been automatically removed (e.g., erased) from the ADWLSV open block list 522, may be automatically replaced by an entry (e.g., at the same entry 1) concerning a superblock (e.g., superblock 8) that is currently open. In at least some embodiments, an entry may be replaced by writing over previously documented status information with information concerning a currently open superblock.

When the allowed entries (e.g., eight entries) of the ADWLSV open block list 522 are all utilized, information (e.g., status) concerning an additional open superblock entry (e.g., superblock 8) may not be allowed until information concerning at least one of the entries (e.g., superblock 1) already documented in the ADWLSV open block list 522 is removed (e.g., due to no longer being open). In a number of embodiments, information concerning the additional open superblock may be stored (e.g., in a buffer) until information concerning the entry already stored in the ADWLSV open block list 522 is removed. Alternatively or in addition, the device controller 120 and/or the system controller 118 (e.g., the set features interface shown at 619 and described in connection with FIG. 6) may, in a number of embodiments, be configured to direct adjustment of the number of entries allowed in the ADWLSV open block list 522 maintained internal to the memory device system 104.

In a number of embodiments, the information concerning an entry (e.g., the status concerning a superblock) already documented in the ADWLSV open block list 522 may be removed due to, for example, a write operation to the plurality of blocks of a superblock being completed (e.g., a last page in a last block of the superblock being programmed). In a number of embodiments, information concerning an entry in the ADWLSV open block list 522 may be removed in response to a command received to remove (e.g., clear, erase, write over) information concerning a particular entry for a block and/or superblock. The command to remove the information concerning the particular entry may be received from the system controller 118 (e.g., via the device controller 120). In one example, the system controller 118 may direct removal of the information concerning the particular entry via the set features interface shown at 619 and described in connection with FIG. 6.

An entry in the ADWLSV open block list 522 may be removed resulting from a request (e.g., a write command) being received to direct initiation of a programming operation to a first page of an already programmed block and/or superblock. Being directed to program the first page of the already programmed block and/or superblock may be considered as initiating another P/E cycle for the block and/or superblock. Initiating another P/E cycle may prompt performance of another round of sampling Vt movement of the pages and/or blocks of the superblock, which results in removal of the already documented status information and replacement of the same with updated status information. The updated status information for the superblock may include documentation of a different block 552 having different ADWLSV info 553 that includes a revised (e.g., increased) voltage for the first block to program based on the dynamic sampling of Vt movement.

The device controller 120 internal to memory device system 104 can be configured to receive a write command from an external controller (e.g., system controller 118) to a memory device (e.g., memory devices 230 and/or 340) including an array of memory cells formed as a plurality of blocks and/or superblocks.

As one example, a write command can be issued to a first page of a word line. Issuing the write command can result in determining a particular voltage in a sequence of applied pulse voltages at which a particular page associated with the word line programs first relative to other pages associated with the word line. The particular voltage can be added to the status of an entry (e.g., documented in 553) of the ADWLSV open block list 522. A write command being issued to a subsequent page of the word line can result in automatically applying the particular voltage as the ADWLSV during performance of the write operation to the subsequent page of the word line.

Initiation of the write command can result in a number of blocks being opened and maintaining, internal to the memory device (e.g., device controller 120) a status of a number of open blocks in the memory device. The status (e.g., as documented in the ADWLSV open block list 522) can include an initiated write operation in the respective number of open blocks, a voltage at which a particular block in the respective number of open blocks includes a first page to program (e.g., as shown at 553) and an indication of which block (e.g., by documenting the block number) in the respective number of open blocks includes the first page to program (e.g., as shown at 552).

Prior to writing the block, the memory device (e.g., device controller 120) can determine from the status the voltage at which the first page programs. The memory device can apply the determined voltage as an ADWLSV during performance of the write operation to the particular open block and the remainder of the respective number of open blocks (e.g., in the superblock).

Maintaining the indication of which block in the respective number of open blocks internal to the memory device (e.g., in the ADWLSV open block list 522 associated with the device controller 120) includes the first page to program can take the place of (e.g., replace) the memory device receiving the indication from the external controller (e.g., the system controller 118 internal to the host 102) in association with the write request. For example, various previous approaches might involve the host and/or system controller 118 thereof tracking open blocks of the memory device and/or managing information concerning word line start voltages. However, available area in the host 102 and/or the system controller 118, complexity, and/or cost thereof, among other considerations, may limit the suitability of performing these operations in the host.

In contrast, such operations may be performed by, and information associated with such operations may be stored (e.g., documented) in, the memory devices and/or device controllers internal to the memory device system 104. The command from the system controller 118 for performance of the programming operation may include the address information related to the pages, blocks, superblocks, and/or word lines. Such address information may be utilized by the memory devices and/or device controllers internal to the memory device system 104 in performance of tracking the open blocks and/or managing information concerning word line start voltages.

In a number of embodiments, the external controller may be a system SSD controller and the memory device may be a multiplane memory device including an internal SSD controller (e.g., device controller 120 internal to the memory device system 104). Based on the status of the number of open blocks, the internal SSD controller can determine which of a number of different voltages, at which the first page programs in a plurality of open blocks, to apply as the ADWLSV. Such a determination may be made by matching a superblock word line address included in the write command to a superblock address associated with the indication of which block in the respective number of open blocks at the superblock address includes the first page to program.

When the write command to the memory device is initiated, a first entry (e.g., as shown at 555 in the ADWLSV open block list 522) can be automatically added (e.g., documented), including a block address corresponding to the write command, to the ADWLSV open block list internal to the memory device. The ADWLSV open block list 522 may be configured to allow a particular number of entries (e.g., eight entries as shown in the example shown in FIG. 5). A second entry (e.g., which may be different from or the same as the first entry) can be automatically removed (e.g., erased or written over) from the ADWLSV open block list 522 upon occurrence of either the write command being issued to a first page of a word line corresponding to the entry or execution of the write command results in performance of the write operation from the first page through a last page of the block. In a number of embodiments, the first entry can be automatically added to the ADWLSV open block list 522 in place of the removed second entry. As an example, the second entry may bring the number of entries in the ADWLSV open block list 522 to the particular number allowed and occurrence of the first entry being added may be contingent upon the second entry being removed.

FIG. 6 illustrates a table illustrating an example of a set features interface 619 maintained internal to a host 102 in accordance with a number of embodiments of the present disclosure. As shown at 119 and described in connection with FIG. 1, the set features interface 619 internal to the host 102 may be associated with (e.g., formed as part of) the system controller 118.

In contrast to the device controller 120 internal to the memory device system 104 being configured to, for example, actively direct tracking of Vts for the memory cells associated with a word line and actively direct adjusting (e.g., increasing) the word line start voltage accordingly, the set features interface 619 of the system controller 118 may be configured instead to monitor and/or control such operations. In a number of embodiments, the table of the set features interface 619 shown in FIG. 6 may include a number of features 661, with a number of the features having a plurality of options 662. The features 661 and/or options 662 in the set features interface 619 may be selectably enabled (e.g., applied) via input of commands. The commands may, in various embodiments, be input from processor 105, memory and bus control 107, peripheral and bus control 109, host memory 116, system controller 118, and/or a user (not shown), among other possibilities.

An example of a feature 661 in the set features interface 619 can be direction of removal 663 of a block and/or a superblock from the ADWLSV open block list (e.g., as shown at 522 and described in connection with FIG. 5). Such removal may be selectably enabled (e.g., directed) to, in a number of embodiments, particular I/O lines 232 and/or data buses 342 (e.g., DQ 0, DQ 1, . . . , DQ 7 shown at 642) and associated page, block, superblock, and/or word line addresses.

For example, removal 663 of blocks optionally may not be enabled 664 (e.g., as a default option 662) concerning data buses DQ 6 and DQ 7 from the ADWLSV open block list 522. Not enabling an option may be achieved by entry of a 0 data value for particular data buses in the set features interface 619 or leaving an entry unchanged from a default value. Removal of selected blocks and/or superblocks 665 from the ADWLSV open block list 522 is another option 662 that may be enabled. For example, removal of selected blocks and/or superblocks may be enabled (e.g., by entry of a 1 data value) for DQ 7 and may be disabled (e.g., by entry of a 0 data value) for DQ 6. Removal of all blocks and/or superblocks 666 from the ADWLSV open block list 522 is another option 662 that may be enabled. For example, removal of all blocks and/or superblocks may be enabled (e.g., by entry of a 1 data value) for DQ 6 and may be disabled (e.g., by entry of a 0 data value) for DQ 7.

Another example of a feature 661 in the set features interface 619 can be direction to read 667 a status of the ADWLSV open block list 522. Reading of such a status may be selectably enabled (e.g., directed) to, in a number of embodiments, particular DQs (e.g., DQ 0, DQ 1, . . . , DQ 7 shown at 642) and associated page, block, superblock, and/or word line addresses. For example, an option 668 (e.g., a default option) may be to read a status of the ADWLSV open block list 522 when a number of entries are still available (e.g., based on the allowed number of entries not yet being utilized). The default option may be achieved by entry of a 0 data value (e.g., as directed by device controller 120) for particular data buses in the set features interface 619 or leaving an entry unchanged from a default value. For example, DQ 7 has the default option enabled. Another option 669 that may be enabled is to read a status of the ADWLSV open block list 522 when all the allowed entries are utilized. This option may be achieved, for example, by entry of a 1 data value for DQ 7 (e.g., as directed by device controller 120). In a number of embodiments, system controller 118 may access (e.g., read) the status of the ADWLSV open block list 522 based upon either of the options just described being enabled by the device controller 120.

Other features 661 and/or options 662 may be available in the set features interface 619 (e.g., as indicated by "reserved"). In addition, more than one set features interface 619 and/or ADWLSV open block list 522 may be maintained for a computing system 100. For example, in a number of embodiments, a plurality of set features interfaces 619 and/or ADWLSV open block lists 522 may be maintained when the memory device system 104 includes a plurality of volatile memory resources 124 and/or non-volatile memory resources 124.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   a memory device comprising a plurality of blocks of memory cells; and
   a controller external to the memory device and coupled thereto via a device interface;
   wherein the memory device is configured to:
   maintain, internal to the memory device, an open block list comprising:
   a particular number of entries corresponding to respective groups of blocks; and
   for each of the particular number of entries, a word line start voltage corresponding to a group of memory cells from among the corresponding group of blocks determined to program first responsive to a program operation performed on the corresponding group of blocks;

remove an entry from the open block list without intervention from the controller external to the memory device;

receive a status request to determine a status of the open block list; and determine the status of the open block list responsive to the status request, wherein the status indicates if the open block list includes available entries.

2. The apparatus of claim 1, wherein the controller external to the memory device is configured to communicate with the memory device via a set features interface.

3. The apparatus of claim 2, wherein the set features interface provides the ability for the controller external to the memory device to remove one or more specific entries from the open block list.

4. The apparatus of claim 2, wherein the set features interface provides the ability for the controller external to the memory device to remove all entries from the open block list.

5. The apparatus of claim 1, wherein the set features interface provides the ability for the controller external to the memory device to read the status of the open block list to determine whether the open block list is full.

6. The apparatus of claim 1, wherein the memory device is further configured to, for each of the particular number of entries, determine the word line start voltage corresponding to the group of memory cells from among the corresponding group of blocks.

7. The apparatus of claim 6, wherein the memory device is further configured to, for each respective group of blocks and subsequent to determining the word line start voltage, program multiple word lines using the determined word line start voltage.

8. The apparatus of claim 1, wherein the group of memory cells from among the corresponding group of blocks is a page of memory cells.

9. A system, comprising:
a system controller external to a memory device;
an internal controller of the memory device, the internal controller coupled to the system controller via a set features interface;
wherein the memory device is configured to maintain an open block list internal to the memory device and configured to accommodate a particular number of entries;
wherein the number of entries correspond to respective groups of blocks of memory cells, with each entry comprising:
an indication of a block from among the corresponding group of blocks determined to program fastest responsive to a program operation performed on the corresponding group of blocks; and
a word line start voltage associated with the corresponding group of blocks determined to program fastest; and
wherein the memory device is configured to receive a status request to determine a status of the open block list, and determine the status of the open block list responsive to the status request, and wherein the status indicates if the open block list includes available entries.

10. The system of claim 9, wherein the memory device is configured to automatically add entries to the open block list without intervention from the system controller.

11. The system of claim 10, wherein the system controller is configured to remove entries from the open block list via the set features interface.

12. The system of claim 9, wherein the system comprises a host coupled to the system controller via a host interface.

13. The system of claim 9, wherein the memory device comprises a solid state drive.

14. The system of claim 9, wherein, for each word line start voltage associated with the corresponding group of blocks determined to program fastest, the memory device is configured to perform a subsequent program operation on the corresponding group of blocks utilizing the word line start voltage.

15. A method, comprising:
maintaining, internal to a memory device that is coupled to an external controller, an open block list, the open block list comprising a plurality of entries each corresponding to one of a respective group of blocks of memory cells;
for each respective group of blocks:
performing a program operation on a word line of each of the blocks of the group;
determining which of the word lines was fastest to program responsive to the program operation;
updating the entry corresponding to the respective group of blocks with a program start voltage associated with the word line determined to program fastest; and
performing, utilizing the program start voltage associated with the word line determined to program fastest, a subsequent program operation on a different word line of each of the blocks of the group;
updating the open block list, without intervention from the external controller, by removing the entries corresponding to respective groups of blocks responsive to either a programming operation performed on last word lines of the respective group of blocks or to an erase operation performed on the respective group of blocks;
providing a status request to determine a status of the open block list; and
determining the status of the open block list responsive to the status request, wherein the status indicates if the open block list includes available entries.

16. The method of claim 15, further comprising, removing a particular entry from the open block list responsive to receiving a set features command from the external controller.

17. The method of claim 15, further comprising, adding a particular entry to the open block list responsive to receiving a set features command from the external controller.

18. The method of claim 15, further comprising, providing the status request from the external controller via a set features interface.

19. The method of claim 15, wherein performing the program operation on the word line comprises performing the program operation on a first word line of each of the blocks in the respective group.

* * * * *